United States Patent [19]

Kible

[11] 4,400,801
[45] Aug. 23, 1983

[54] READ/WRITE CIRCUIT FOR A RANDOM ACCESS MEMORY

[75] Inventor: Dieter Kible, Gärtringen, Fed. Rep. of Germany

[73] Assignee: Hewlett-Packard GmbH, Boeblingen, Fed. Rep. of Germany

[21] Appl. No.: 213,131

[22] Filed: Dec. 4, 1980

[30] Foreign Application Priority Data

Dec. 22, 1979 [DE] Fed. Rep. of Germany ....... 2952056

[51] Int. Cl.³ .............................................. G11C 7/00
[52] U.S. Cl. .................................... 365/195; 365/189
[58] Field of Search ............... 365/189, 195, 221, 230; 307/238.1, 238.8

[56] References Cited

U.S. PATENT DOCUMENTS 3,969,706 7/1976 Proebsting .......................... 365/189
4,141,039 2/1979 Yamamoto .......................... 365/230

OTHER PUBLICATIONS

Kroeger, "Operation of the Am 9130/40 4K Static r.a.m.s.", *New Electronics*, vol. 9, No. 19, pp. 38, 41, 43, Oct. 5, 1976.

*Primary Examiner*—John C. Martin
*Attorney, Agent, or Firm*—Patrick J. Barrett

[57] ABSTRACT

A read/write circuit for a random access memory comprises mode switching means for placing the memory into a read mode if an external read request signal is received and for placing the memory into a write mode if an external write request signal is received. A priority circuit controls said mode switching means and prevents it from placing the memory into the read mode as long as a write request signal is present and enables said mode switching means for placing the memory into the read mode after each write operation has been completed. A read-out control circuit is responsive to the read request signal for enabling a read operation at the next following read mode enabling and for repeating the read operation at the subsequent read mode enabling if the read operation was not completed before the termination of the read mode enabling.

7 Claims, 2 Drawing Figures

READ/WRITE CIRCUIT FOR A RANDOM ACCESS MEMORY

BACKGROUND OF THE INVENTION

Typical random access memories (RAMs) are capable of either being loaded or being read within a particular time interval. If such a memory is asynchronously loaded with cycle times near the lower limit cycle time, there is no possibility of reading loaded data since a reading cycle may suppress a write cycle which may cause loss of data.

SUMMARY OF THE INVENTION

The preferred embodiment of the present invention provides a read/write circuit for a random access memory which allows a virtually simultaneous writing and reading (seen from the user's side).

According to the preferred embodiment of the present invention this circuit comprises mode switching means for placing the memory into a read mode if an external read request signal is received and for placing the memory into a write mode if an external write request signal is received. It further comprises a priority circuit for controlling said mode switching means for preventing it from placing the memory into the read mode, as long as a write request signal is present and for enabling said mode switching means for placing the memory into the read mode every time after a write operation has been completed. Moreover a read out control circuit is provided which is responsive to the read request signal for enabling a read operation at the next following read mode enabling and for repeating the read operation at the subsequent read mode enabling if the read operation was not completed before termination of the read mode enabling. According to the preferred embodiment of the present invention writing is privileged over reading, thus, no data loss can occur during a write operation. Reading is performed in the intervals between the write operations. If such an interval is not long enough for a read operation, the latter is repeated during the next following interval. If this interval is still not sufficient, a further repetition takes place during the subsequent interval. This is continued until a complete reading of the requested data is possible within one interval.

The circuit disclosed is especially suitable for a rate transformation between a data generator and a data receiver if the data generator transmits data at a high rate but not continuously, and the data receiver is capable of receiving data at a relatively low rate.

DESCRIPTION OF THE PREFERRED EMBODIMENT

Figure 1:
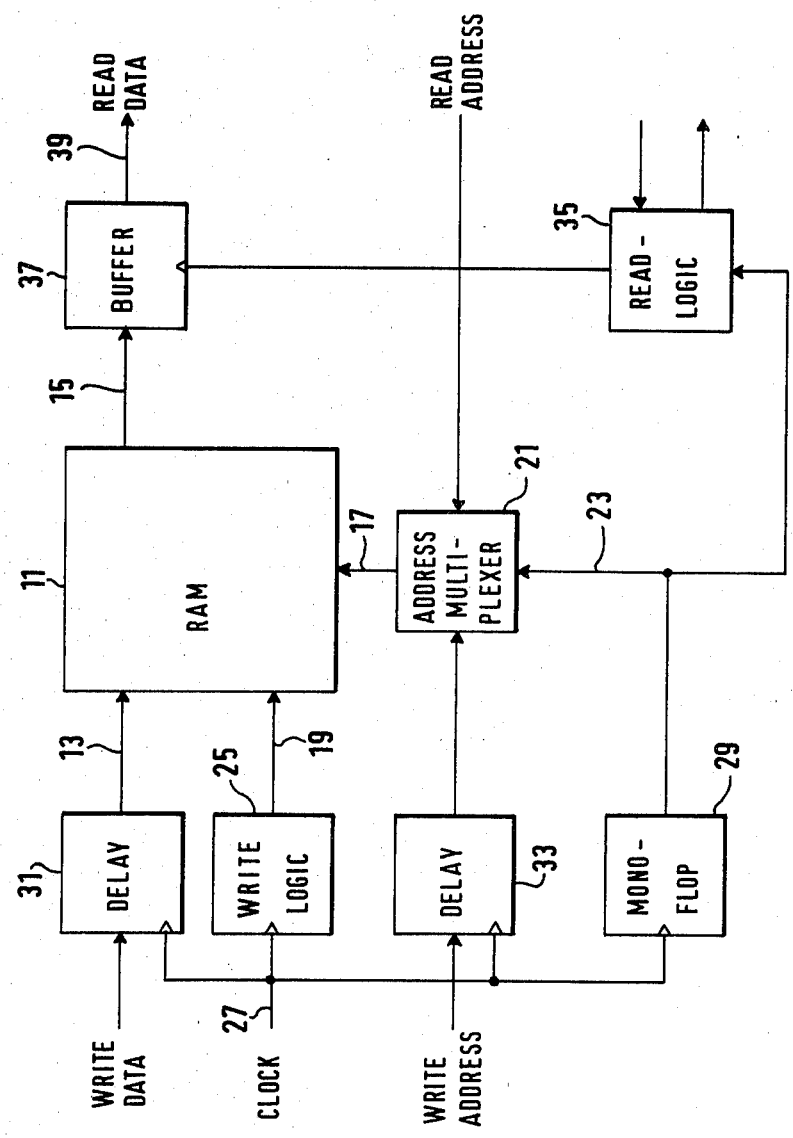
FIG. 1 is a schematic block diagram of a circuit according to the preferred embodiment of the present invention illustrating the principle thereof.

In FIG. 1 reference numeral 11 designates a random access memory (RAM). Via an input port 13 data can be read into the RAM 11, and data can be read out via an output port 15. The addresses related to the data are supplied to the RAM 11 via an address port 17. Moreover, RAM 11 has a write pulse input 19.

Either a write or a read address is supplied to address port 17 from an address multiplexer 21 depending on the state of a read/write select line 23. Write pulses necessary for a write operation and corresponding to a write clock at a clock input 27 are supplied to write pulse input 19 from write logic 25. The write clock at clock input 27 additionally controls a retriggerable monoflop (monostable multivibrator) 29 which switches the read/write select line 23 to "write" for a predetermined time interval upon each clock pulse.

Delay elements 31 and 33 are incorporated into the write data and write address lines, respectively, and synchronize write data and addresses on the clock pulse.

Read logic 35 receives read requests and provides a read confirmation signal upon each successful read operation from RAM 11. Read logic 35 is connected to read/write select line 23 and has its output connected to a buffer 37 for the read data. Buffer 37 upon a command of read logic 35 stores read data from output port 15 of RAM 11 and keeps these data at its output 39 for further processing.

In the embodiment according to FIG. 1 a write operation is performed as follows:

A write clock pulse at clock input 27 causes monoflop 29 to switch read/write select line 23 to "write". Select line 23 remains in the "write" state until the write operation is completely terminated. If a further write operation is performed immediately after the previous write operation is terminated, select line 23 remains in the "write" state due to the fact that monoflop 29 is retriggerable. Select line 23 enables address multiplexer 23 to receive the corresponding write address. As can be seen from FIG. 1, the write clock also triggers delay elements 31 and 33. After a delay time corresponding to the RAM data, write logic 25 delivers a write pulse to write pulse input 19 of RAM 11, and the data present at input port 13 of RAM 11 are loaded. If no further write operation follows this write operation, monoflop 29 switches read/write select line 23 to the "read" state.

A read operation is performed as follows:

By means of a read request signal read logic 35 is given the command to read data from RAM 11, the data being specified by the read address. This reading is started if and as soon as read/write select line 23 assumes its "read" state. The required data is then read from RAM 11 into buffer 37. If this operation is terminated undisturbed, read logic 35 outputs a read confirmation signal and enables output of the read data from buffer 37. However, if select line 23 is switched to the "write" state before the data specified by the read address are completely read from RAM 11 into buffer 37, the read confirmation signal is suppressed by read logic 35, and the read operation is repeated as soon as select line 23 again assumes its "read" state.

Figure 2:
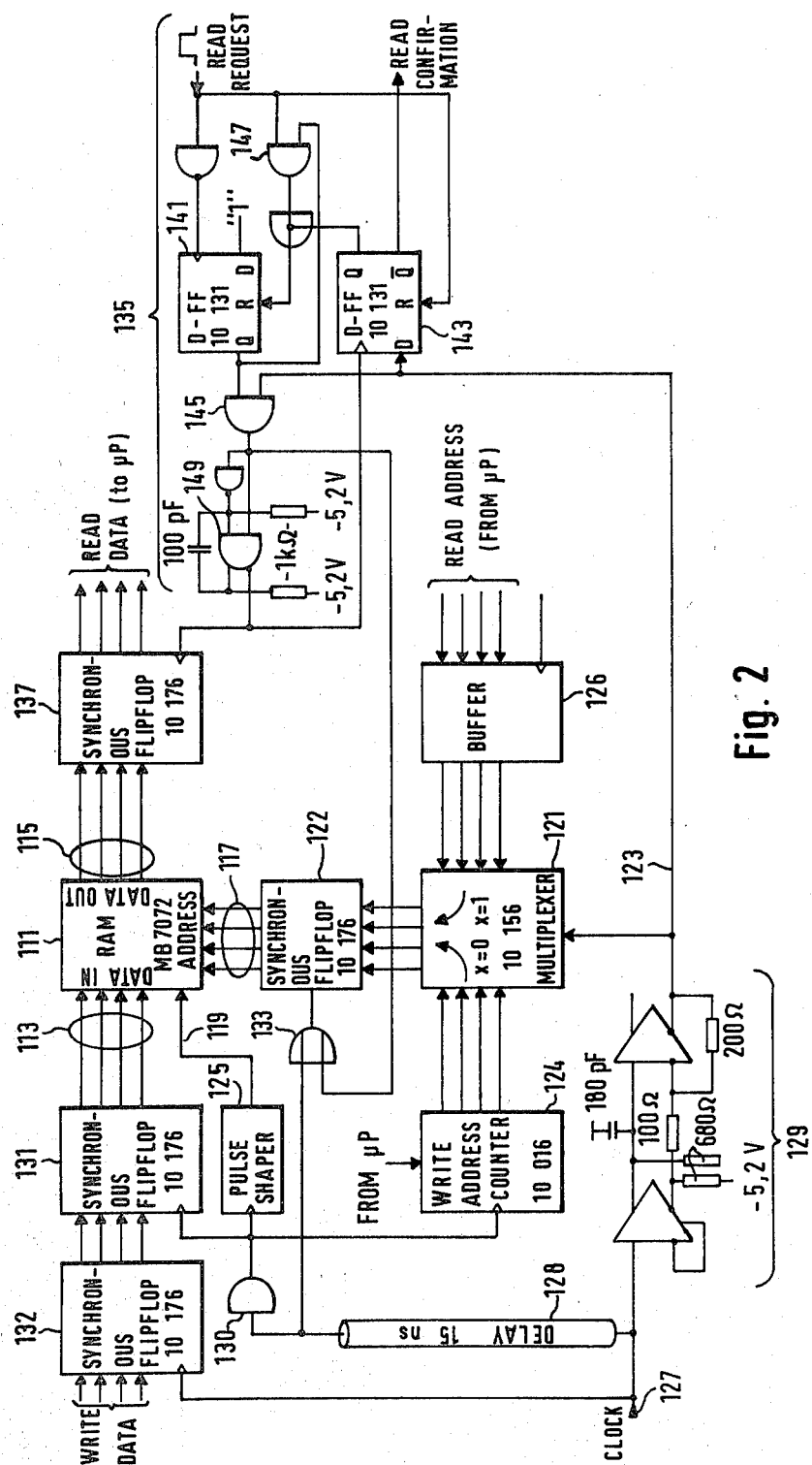
FIG. 2 shows a detailed circuit diagram of the circuit according to FIG. 1 implemented in ECL Technology.

FIG. 2 shows a detailed circuit implementing the operation of the scheme according to FIG. 1. All components are of the ECL (Emitter Coupled Logic) type. Supply voltages and so-called pull-down resistors are not shown (as far as they have no special functions) for greater clarity. This circuit has to operate at frequencies up to 50 MHz corresponding to a cycle time of 20 nanoseconds. The typical delay time of an ECL gate is about 2 nanoseconds, and careful attention must be paid to this in the circuit design.

In FIG. 2 the RAM is designated by reference numeral 111. It comprises a data input port 113, a data output port 115, an address input port 117 (only four address lines are shown for the purpose of simplification), and a write pulse input 119. Address input port 117 is connected to a multiplexer 121 via a synchronous flipflop 122. Multiplexer 121 is switchable between two states by means of a read/write select line 123. In one state signal x=1 on select line 123) it transfers a read address, and in the other state (x=0) it transfers a write address to synchronous flipflop 122. The write addresses are provided by a write address counter 124 which is started by a microprocessor (μP) (not shown in the drawing). The read addresses are provided by the microprocessor via a latch or buffer 126.

A write pulse $\overline{WE}$ delivered to input 119 of RAM 111 is generated by a pulse shaper 125 every time a clock pulse arrives at in the input thereof. Write pulse $\overline{WE}$ is exactly adjusted in time to the RAM 111 and the input of the write data taking into account the set up time, hold time and the minimum pulse width. Pulse shaper 125 gets its input pulses from a clock input 127 for the write clock via a delay line 128 and a gate 130 acting as a further delay. The output signal of gate 130 additionally is delivered to write address counter 124 as well as to a synchronous flipflop 131 through which the write data are transferred.

A further synchronous flipflop 132 is incorporated into the write data lines in front of synchronous flipflop 131. The write clock signal from clock input 127 is delivered to synchronous flipflop 132 without delay. The output signal of delay line 128 additionally is delivered to one input of an OR gate 133, the other input of which is connected to a read logic 135. The operation of read logic 135 is described in detail below. The output signal of OR gate 133 controls synchronous flipflop 122.

A retriggerable monoflop 129 comprising two comparators receives the write clock signal from clock input 127 and generates the signal "x" on read/write select line 123. Select line 123 is also connected to read logic 135.

Read logic 135 substantially consists of a D flipflop 141 for read request, a D flipflop 143 for read confirmation, AND gates 145 and 147 and a gate 149 providing a predetermined delay. Read logic 135 controls a synchronous flipflop 137 through which the read data are transferred.

In the circuit according to FIG. 2 a write operation is performed as follows:

The leading edge of a write clock signal at clock input 127 causes synchronous flipflop 132 to accept data. After a time delay determined by delay line 128 and gates 130 and 133 synchronous flipflop 131 accepts the data, and synchronous flipflop 122 accepts the corresponding address, so that data and address are simultaneously present at RAM 111. At the same time pulse shaper 125 delivers a write pulse to RAM 111. Write address counter 124 continues counting by 1 and its new state is transmitted via multiplexer 121 to synchronous flipflop 122 where it is present for the next write operation. Retriggerable monoflop 129 then applies signal x=0 on read/write select line 123 upon the write clock pulse at clock input 127. The delay of monoflop 129 is chosen so that the signal x=0 is maintained for at least 20 nanoseconds after the last write clock pulse has elapsed. If the period duration of the write clock is shorter than its pulse width plus the hold time of monoflop 129, "x" is continuously logic 0. Signal x=0 also generates a logic 0 signal at AND gate 145 and in turn at the lower input of OR gate 133. The latter occurs in relation to the leading edge of the write clock pulse at clock input 127 within a delay of 4 to 10 nanoseconds. That means that the write pulse which is delayed in delay line 128 about 15 nanoseconds is transmitted without influence to synchronous flipflop 122. If a write operation is performed after a longer interruption (x=1) the circuit is unconditionally switched into the write mode. Thus, no data can be lost.

A read operation is performed as follows:

The leading edge of a read request pulse sets D flipflops 141 and 143 to their rest positions (Q=0). The trailing edge of the read request pulse sets output Q of flipflop 141 to logic 1 and in turn also the output of AND gate 145 provided x=1. The read address meanwhile present at the output of multiplexer 121 is then transferred into synchronous flipflop 122 and thus is present at RAM 111. After the access time has elapsed data stored at said read address appear at output port 115 of RAM 111 and can be transferred into synchronous flipflop 137 if enabled by the output signal of gate 149 having a predetermined delay. Simultaneously the instantaneous state of signal "x" is transferred into D flipflop 143. If x=1 still at this moment the read attempt was successful i.e. data in synchronous flipflop 137 are valid. D flipflop 141 is then reset, and the signal $\overline{Read\ Confirmation}$ is delivered to the microprocessor which now may read the data from synchronous flipflop 137. Signal $\overline{Read\ Confirmation}$ is not reset before a new read request pulse occurs. If signal "x" on read/write select line 123 becomes logic 0 during a read operation (i.e. a write operation occurred in the meantime) signal $\overline{Read\ Confirmation}$ is disabled since the output signal of AND gate 145 is logic 0 until signal "x" again becomes logic 1. The latter has the same consequences as a new read request pulse. This action is repeated until the complete read operation can be performed successfully.

Assuming the duration of a write operation and of a read operation is each 20 nanoseconds, then a read operation is always possible when the time interval between two write clock pulses is longer than 40 nanoseconds. If the time interval between two write clock pulses is shorter than 40 nanoseconds, a read operation is not possible. However, the maximum time during which the RAM 111 cannot be read is limited by the capacity thereof. If the capacity is 1024 words, a read operation is not possible for 1024×40 nanoseconds ≈4.1 μsec. If a microprocessor is used which has a read operation that takes e.g. 5 μsec (e.g. Motorola MC 6809), then in the worst case a read operation will have to be carried out twice.

The microprocessor reads data from RAM 111 as follows:
1. Input the required read address into latch 126.
2. Initialize a read request signal.
3. Check whether signal $\overline{Read\ Confirmation}$ was given, if not, repeat this.
4. Read data from synchronous flipflop 137.

Steps 1. and 2. can be combined if the read request pulse is used as write pulse for latch 126. However, in this case it should be noted that there is a certain time delay until data from latch 126 are present in synchronous flipflop 122.

I claim:
1. A read/write circuit for a random access memory including an output circuit, the read/write circuit comprising:
   write logic means having an input for receiving a write request signal and coupled to the memory for supplying write signals thereto;

switching means having an input for receiving the write request signal and coupled to the memory for selectively supplying write or read address signals to the memory;

read logic means, coupled to the switching means and the memory output circuit and having inputs for receiving a read request signal and a read select signal, for initiating the reading of information from the memory in response to a read request signal and a read select signal and for reinitiating the reading of information from the memory in response to a read select signal when the reading of information was previously terminated before completion; and priority circuit means having an input for receiving the write request signal and coupled to the switching means and the read logic means for permitting the switching means to supply a write address signal to the memory, for supplying the read select signal to the read logic means in the absence of a write request signal, and for preventing the initiation of reading of information from the memory and terminating any current reading of information from the memory in response to the write request signal.

2. A circuit as in claim 1 wherein the priority circuit means comprises a retriggerable monostable multivibrator having a write clock input and an output, having a delay time matched to the duration of a write operation and generating an output signal for driving the switching means.

3. A circuit as in claim 1 wherein the switching means comprises an address multiplexer having an address input, a control input and an output, the address input of which receives write and read addresses and the output of which is connected to an address input of the memory.

4. A circuit as in claim 1 wherein the read logic means produces a read confirmation signal if a read operation has been successfully completed.

5. A circuit as in claim 3 wherein the priority circuit means comprises a retriggerable monostable multivibrator having a write clock input and an output and having a delay time matched to the duration of a write operation, the output being connected to the switching means control input for driving the switching means.

6. A circuit as in claim 1, 2, 3, 4 or 5 further comprising write control means coupled to the switching means and the priority circuit means for supplying data to and causing it to be written into the memory in response to the write request signal.

7. A read/write circuit as in claim 1 wherein the memory output circuit comprises a buffer register coupled to the memory and to the read logic means for storing information being read out from the memory.

* * * * *